United States Patent
Tanaka et al.

(10) Patent No.: US 11,245,393 B2
(45) Date of Patent: Feb. 8, 2022

(54) DRIVING METHOD AND DRIVE CIRCUIT FOR SEMICONDUCTOR DEVICE

(71) Applicant: Mitsubishi Electric Corporation, Tokyo (JP)

(72) Inventors: Sho Tanaka, Tokyo (JP); Shigeru Kusunoki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/466,341

(22) PCT Filed: Dec. 12, 2016

(86) PCT No.: PCT/JP2016/086858
§ 371 (c)(1),
(2) Date: Jun. 4, 2019

(87) PCT Pub. No.: WO2018/109794
PCT Pub. Date: Jun. 21, 2018

(65) Prior Publication Data
US 2020/0083879 A1    Mar. 12, 2020

(51) Int. Cl.
*H03K 17/081* (2006.01)
*H01L 29/06* (2006.01)
(Continued)

(52) U.S. Cl.
CPC .... *H03K 17/08116* (2013.01); *H01L 29/0696* (2013.01); *H01L 29/7397* (2013.01); *H01L 27/0248* (2013.01)

(58) Field of Classification Search
CPC ............. H01L 29/0696; H01L 29/7397; H01L 27/0248; H03K 17/0812; H03K 17/0814; H03K 17/08116
See application file for complete search history.

(56) References Cited

U.S. PATENT DOCUMENTS 9,722,581 B2 * 8/2017 Zhao ..................... H03K 17/127
10,771,053 B2 * 9/2020 Eguchi ............... H03K 17/6871
(Continued)

FOREIGN PATENT DOCUMENTS

| JP | H06-85268 A | 3/1994 |
| JP | 2004-319624 | * 11/2004 |
| JP | 2004-319624 A | 11/2004 |

OTHER PUBLICATIONS

International Search Report issued in PCT/JP2016/086858; dated Feb. 28, 2017.

*Primary Examiner* — Patrick C Chen
(74) *Attorney, Agent, or Firm* — Studebaker & Brackett PC

(57) ABSTRACT

A semiconductor device includes a plurality of first transistor cells and a plurality of second transistor cells that are electrically connected in parallel between a collector electrode and an emitter electrode. A gate voltage on each of the plurality of first transistor cells is controlled by a first gate interconnection. A gate voltage on each of the plurality of second transistor cells is controlled by a second gate interconnection. A drive circuit is configured to: apply an ON-voltage of the semiconductor device to each of the first and second gate interconnections when the semiconductor device is turned on; and after a lapse of a predetermined time period since start of application of the ON-voltage, apply an OFF-voltage of the semiconductor device to the second gate interconnection and apply an ON-voltage to the first gate interconnection.

4 Claims, 7 Drawing Sheets

(51) Int. Cl.
*H01L 29/739* (2006.01)
*H01L 27/02* (2006.01)

(56) References Cited

U.S. PATENT DOCUMENTS

| | | | |
|---|---|---|---|
| 2001/0050853 A1* | 12/2001 | Morita | H02M 3/33569 363/21.01 |
| 2011/0291744 A1* | 12/2011 | Kim | G11C 17/18 327/525 |
| 2012/0280728 A1* | 11/2012 | Hussein | H03K 17/127 327/155 |
| 2016/0126718 A1* | 5/2016 | Naito | H02H 3/087 361/101 |
| 2019/0273494 A1* | 9/2019 | Matsumoto | H03K 17/60 |

* cited by examiner

DRIVING METHOD AND DRIVE CIRCUIT FOR SEMICONDUCTOR DEVICE

TECHNICAL FIELD

The present invention relates to a driving method and a drive circuit for a semiconductor device, and more particularly to a driving method and a drive circuit for a voltage driven-type semiconductor device.

BACKGROUND ART

As one of power semiconductor devices, there is a known voltage driven-type semiconductor device that is controlled to be turned on or off according to the voltage on a gate electrode, which is typified by a metal-oxide-semiconductor field-effect transistor (MOS-FET) and an insulated gate bipolar transistor (IGBT).

Japanese Patent Laying-Open No. 2004-319624 (PTL 1) discloses that one semiconductor device is configured by a parallel connection of: a plurality of first gate voltage driven-type semiconductor elements each having a gate connected to the first gate pattern; and a plurality of second gate voltage driven-type semiconductor elements each having a gate connected to the second gate pattern. Furthermore, it also discloses that a breakage caused by a surge voltage is prevented by causing the voltage change during turn-off of the semiconductor element to occur at different timings between the first gate pattern and the second gate pattern.

Furthermore, Japanese Patent Laying-Open No. 06-85268 (PTL 2) also discloses a structure of dividing a gate electrode of a power semiconductor element into a plurality of gate electrodes. PTL 2 discloses a configuration in which a gate electrode among the divided gate electrodes that has a gate-source withstand voltage not reaching a prescribed value is connected not to a gate terminal but to a source terminal, thereby preventing the region below this gate electrode from operating as an IGBT.

CITATION LIST

Patent Literature

PTL 1: Japanese Patent Laying-Open No. 2004-319624
PTL 2: Japanese Patent Laying-Open No. 06-85268

SUMMARY OF INVENTION

Technical Problem

For the voltage driven-type semiconductor device, switching loss during turn-on and turn-off of the semiconductor device needs to be suppressed. In particular, during turn-on, when a high electronic current is supplied, the corresponding holes are increased accordingly, thereby reducing the time period required to complete turn-on. Thus, switching loss is reduced.

On the other hand, for the voltage driven-type semiconductor device, it is desirable that a short-circuit duration is long, which is taken until a short-circuit fault occurs in the semiconductor device when an overcurrent flows due to occurrence of a load short-circuit and the like. Generally, the short-circuit duration is a time period required until $\int(Ic \times Vce) \, dt$ as a time integral value of the power (Ic×Vce) obtained by multiplying a current (a collector current Ic in the IGBT) by a voltage (a collector-emitter voltage Vce in the IGBT) reaches an ESC defined by the energy by which the semiconductor device can withstand during a short-circuit. In this case, the ESC is approximately set depending on the size of the semiconductor chip. Also, Vce during a short-circuit is approximately set by the voltage of the power supply to which the semiconductor device is connected. Accordingly, in order to increase the short-circuit duration, collector current Ic needs to be suppressed.

However, the magnitude of collector current Ic is proportional to the magnitude of the electronic current supplied during turn-on. Thus, collector current Ic is increased for suppressing switching loss, which is however disadvantageous for securing the short-circuit duration, so that it is understood that a trade-off relation is established therebetween. In this way, for the voltage driven-type semiconductor device, it is difficult to improve the short-circuit duration while maintaining the element performance typified by switching loss.

The present invention has been made in order to solve the above-described problems. An object of the present invention is to secure a short-circuit duration for a voltage driven-type semiconductor device without increasing switching loss.

Solution to Problem

In an aspect of the present disclosure, a method of driving a semiconductor device including a plurality of semiconductor elements electrically connected in parallel and a plurality of gate interconnections electrically insulated from each other is provided. The plurality of gate interconnections include a first gate interconnection and a second gate interconnection. The plurality of semiconductor elements include at least one first semiconductor element having a first channel region in which a current is controlled by a voltage on the first gate interconnection, and at least one second semiconductor element having a second channel region in which a current is controlled by a voltage on the second gate interconnection. The method includes: applying an ON-voltage of the semiconductor device to each of the first gate interconnection and the second gate interconnection when the semiconductor device is turned on; and after a lapse of a predetermined time period since start of application of the ON-voltage, applying an OFF-voltage of the semiconductor device to the second gate interconnection and applying the ON-voltage to the first gate interconnection.

In another aspect of the present disclosure, a drive circuit for a semiconductor device including a plurality of semiconductor elements electrically connected in parallel and a plurality of gate interconnections electrically insulated from each other is provided. The drive circuit includes a first gate voltage controller and a second gate voltage controller. The plurality of gate interconnections include a first gate interconnection and a second gate interconnection. The plurality of semiconductor elements include at least one first semiconductor element having a first channel region in which a current is controlled by a voltage on the first gate interconnection, and at least one second semiconductor element having a second channel region in which a current is controlled by a voltage on the second gate interconnection. The first gate voltage controller is configured to apply an ON-voltage or an OFF-voltage of the semiconductor device to the first gate interconnection according to a drive control signal. The drive control signal transitions from a first signal level to a second signal level when the semiconductor device is turned on and transitions from the second signal level to the first signal level when the semiconductor device is turned off. The second gate voltage controller is configured to apply an ON-voltage or an OFF-voltage to the second gate interconnection according to the drive control signal. The first gate voltage controller is configured to apply the OFF-voltage to the first gate interconnection when the drive control signal is at the first signal level and apply the ON-voltage to the first gate interconnection when the drive control signal is at the second signal level. The second gate voltage controller is configured to apply the ON-voltage in a pulse pattern to the second gate interconnection in a predetermined time width when the drive control signal transitions from the first signal level to the second signal level.

Advantageous Effects of Invention

According to the present invention, for a voltage driven-type semiconductor device, a short-circuit duration can be secured without increasing switching loss.

DESCRIPTION OF EMBODIMENTS

Figure 1:
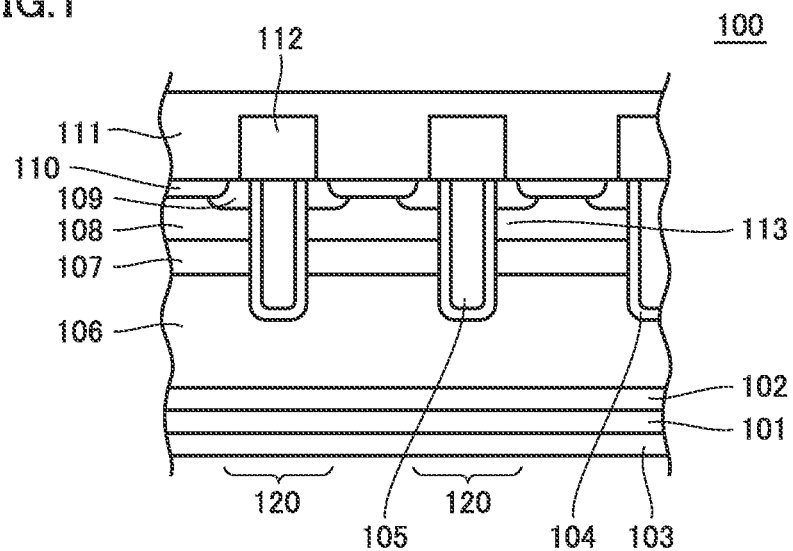
FIG. 1 is a cross-sectional view for illustrating an example of the configuration of a semiconductor device to which a driving method according to the present embodiment is applied.

The embodiments of the present invention will be hereinafter described with reference to the accompanying drawings. In the following description, the same or corresponding components are designated by the same reference characters, and description thereof will not be basically repeated.

FIG. 1 is a cross-sectional view for illustrating an example of the configuration of a semiconductor device 100 to which a driving method according to the present embodiment is applied.

Referring to FIG. 1, semiconductor device 100 includes an $N^+$ buffer layer 102, an $N^-$ drift layer 106, a charge storage layer 107, a channel dope layer 108, a source injection region 109, and a $P^+$ diffusion region 110, that are formed on the upper surface of a $P^+$ substrate 101. $P^+$ substrate 101 has a rear surface on which a collector electrode 103 is formed. $P^+$ substrate 101 functions as a collector layer.

Furthermore, semiconductor device 100 includes an emitter electrode 111 and a plurality of gate electrodes 105. Emitter electrode 111 is formed on a part of source injection region 109 (a region where an oxide film 112 is not formed) and the upper surface of $P^+$ diffusion region 110. Emitter electrode 111 is provided on the first main surface side of the semiconductor chip. Collector electrode 103 is provided on the second main surface on the opposite side of the first main surface. On the first main surface, emitter electrode 111 and the plurality of gate electrodes 105 are insulated by oxide film 112. Furthermore, gate electrode 105 is electrically insulated by gate insulating film 104 from each of surrounding layers and regions.

Each gate electrode 105 is configured by a gate interconnection formed of an electric conductor (for example, polysilicon) embedded in a trench provided in stripes so as to extend in the direction vertical to the surface of the sheet of paper showing FIG. 1. Semiconductor device 100 shown in FIG. 1 has the so-called carrier stored trench-gate bipolar transistor (CSTBT (registered trademark)) structure, in which a transistor cell 120 is formed for each gate electrode 105 so as to have a channel region 113 where a current changes depending on the electric field according to the voltage on the gate electrode (which will be hereinafter also simply referred to as a "gate voltage").

Each transistor cell 120 is provided with channel region 113 in which the current is controlled according to the voltage on gate electrode 105. In the vertical transistor structure including a CSTBT structure by way of example, the pitch between the plurality of gate interconnections formed in a trench shape is reduced so as to form a large number of transistor cells 120, thereby allowing reduction in ON-resistance.

In this way, semiconductor device 100 has a configuration in which a plurality of transistor cells 120 are electrically connected in parallel while providing collector electrode 103 and emitter electrode 111 in common on the same chip. Specifically, in semiconductor device 100, a current proportional to the total sum of the electronic currents in channel regions 113 each controlled according to the voltage on each gate electrode 105 (hereinafter also referred to as a collector current Ic) is generated between collector electrode 103 and emitter electrode 111 that function as a pair of main electrodes. In this way, semiconductor device 100 functions as a voltage driven-type switching element capable of controlling collector current Ic according to the gate voltage.

Figure 2:
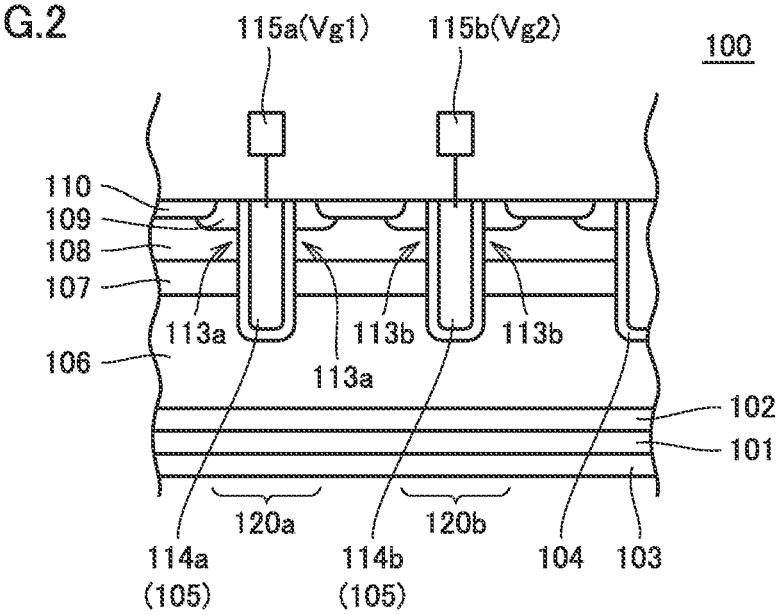
FIG. 2 is a conceptual cross-sectional view illustrating the configuration for supplying a gate voltage to the semiconductor device in FIG. 1.

FIG. 2 shows a conceptual cross-sectional view illustrating the configuration for supplying a gate voltage to semiconductor device 100.

FIG. 2 conceptually shows the configuration for supplying a gate voltage in place of emitter electrode 111 and oxide film 112 in FIG. 1.

In semiconductor device 100, a plurality of gate electrodes 105 are configured by a plurality of gate interconnections insulated from each other. In the example in FIG. 2, two types of gate interconnections 114a and 114b are disposed. Gate interconnections 114a and 114b are electrically connected to gate pads 115a and 115b, respectively. Gate pads 115a and 115b are electrically insulated from each other and receive separate voltage signals from a drive circuit, which will be described later.

Consequently, it is understood that the plurality of transistor cells 120 include: a transistor cell 120a having gate electrode 105 formed by gate interconnection 114a; and a transistor cell 120b having gate electrode 105 formed by gate interconnection 114b. Transistor cell 120a has a channel region 113a in which a current is controlled according to the voltage on gate interconnection 114a. Transistor cell 120b has a channel region 113b in which a current is controlled according to the voltage on gate interconnection 114b.

In this way, gate interconnection 114a corresponds to the "first gate interconnection", channel region 113a corresponds to the "first channel region", and transistor cell 120a corresponds to the "first semiconductor element". Also, gate interconnection 114b corresponds to the "second gate interconnection", channel region 113b corresponds to the "second channel region", and transistor cell 120b corresponds to the "second semiconductor element".

Figure 3:
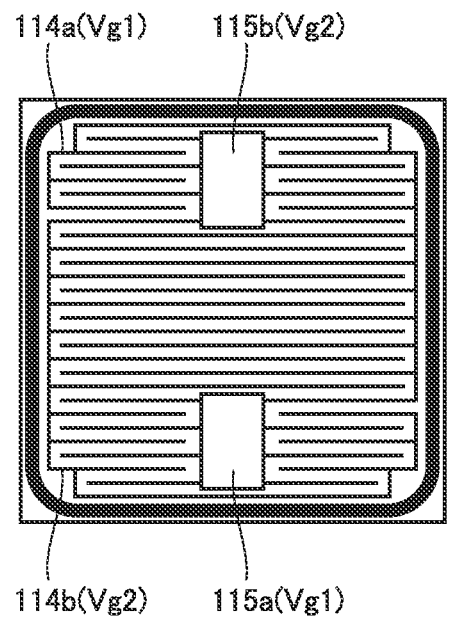
FIG. 3 is a plan view illustrating the first arrangement example of a gate interconnection in the semiconductor device shown in FIGS. 1 and 2.
Figure 4:
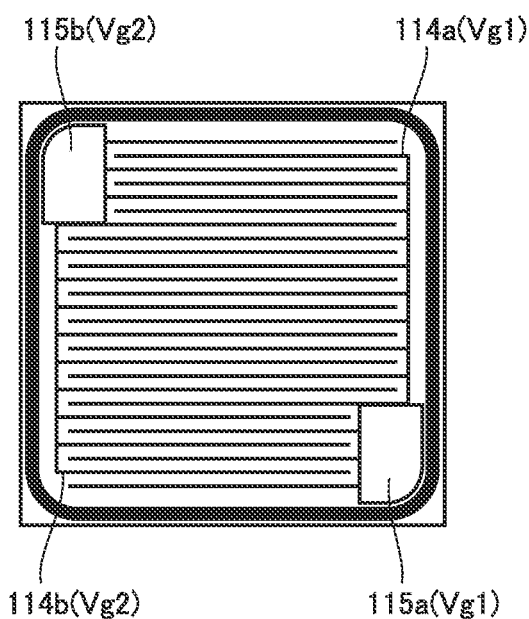
FIG. 4 is a plan view illustrating the second arrangement example of the gate interconnection in the semiconductor device shown in FIGS. 1 and 2.

FIGS. 3 and 4 each show a plan view of semiconductor device 100 as seen from the first main surface side for illustrating an arrangement example of gate interconnections 114a and 114b. FIGS. 3 and 4 each show only gate interconnections and gate pads.

Referring to FIGS. 3 and 4, gate interconnections 114a and 114b are provided to include a periodical interconnection pattern for forming a gate electrode portion extending in the same direction (in the left-to-right direction in the figure). Furthermore, gate interconnection 114a is electrically connected to gate pad 115a. Gate interconnection 114b is electrically connected to gate pad 115b.

Gate pads 115a and 115b can be provided in an interconnection layer different from the interconnection layer where gate interconnections 114a and 114b are provided. It is preferable that gate pads 115a and 115b are symmetrically (line-symmetrically or point-symmetrically) arranged on the first main surface of semiconductor device 100 in order to avoid interference between the wires connected to gate pads 115a and 115b.

A gate voltage signal Vg1 is supplied to gate pad 115a. A gate voltage signal Vg2 is supplied to gate pad 115b. Consequently, the voltage on gate interconnection 114a is defined by gate voltage signal Vg1 while the voltage on gate interconnection 114b is defined by gate voltage signal Vg2.

In FIGS. 3 and 4, two types of gate interconnections are periodically arranged in order of "114a, 114b, 114a, 114b . . . ", but can also be periodically arranged in a different order. The number of arranged gate interconnections 114a and the number of arranged gate interconnections 114b may be different as long as these two types of gate interconnections are periodically arranged, for example, as in "114a, 114b, 114b, 114a, 114b, 114b, . . . " or "114a, 114a, 114a, 114b, 114a, 114a, 114a, 114b, 114a, . . . ".

Figure 5:
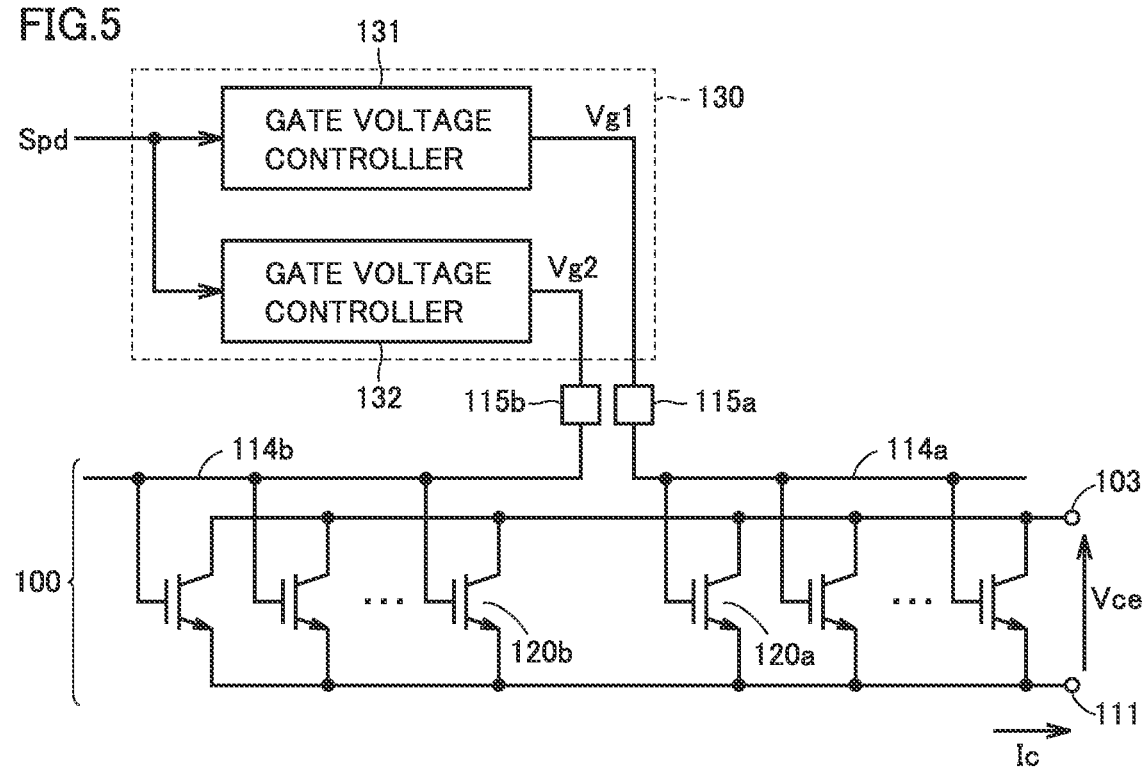
FIG. 5 is a conceptual circuit diagram illustrating the driving configuration of the semiconductor device according to the present embodiment.

FIG. 5 is a conceptual circuit diagram illustrating the driving configuration of the semiconductor device according to the present embodiment.

Referring to FIG. 5, semiconductor device 100 is shown as an equivalent circuit having a configuration in which a plurality of transistor cells 120a for which a gate voltage signal is controlled by gate interconnection 114a, and a plurality of transistor cells 120b for which a gate voltage signal is controlled by gate interconnection 114b are connected in parallel between collector electrode 103 and emitter electrode 111.

In the state where a voltage is applied between collector electrode 103 and emitter electrode 111, semiconductor device 100 is turned on when the gate-emitter voltage is higher than a threshold voltage. In the ON-state, a collector-emitter voltage Vce is approximately equal to zero. Collector current Ic is shown by a total sum of: the sum of the electronic current and the hole current that are produced in the plurality of transistor cells 120a according to the voltage on gate interconnection 114a; and the sum of the electronic current and the hole current that are produced in the plurality of transistor cells 120b according to the voltage on gate interconnection 114b.

On the other hand, semiconductor device 100 is turned off when the gate voltage is lower than the threshold voltage. In the OFF state, Ic=0.

A drive circuit 130 for semiconductor device 100 causes semiconductor device 100 to be turned on and off according to the signal level of a drive control signal Spd. For example, drive circuit 130 operates to cause semiconductor device 100 to be turned off in a time period in which drive control signal Spd is at a logic low level (which will be also simply referred to as an "L level"), and to cause semiconductor device 100 to be turned on in a time period in which drive control signal Spd is at a logic high level (which will be also simply referred to as an "H level").

Drive circuit 130 includes a gate voltage controller 131 and a gate voltage controller 132. Gate voltage controller 131 generates a gate voltage signal Vg1 according to drive control signal Spd. Gate voltage signal Vg1 is supplied to gate interconnection 114a through gate pad 115a. Gate voltage controller 132 generates a gate voltage signal Vg2 according to drive control signal Spd. Gate voltage signal Vg2 is supplied to gate interconnection 114b through gate pad 115b.

Figure 6:
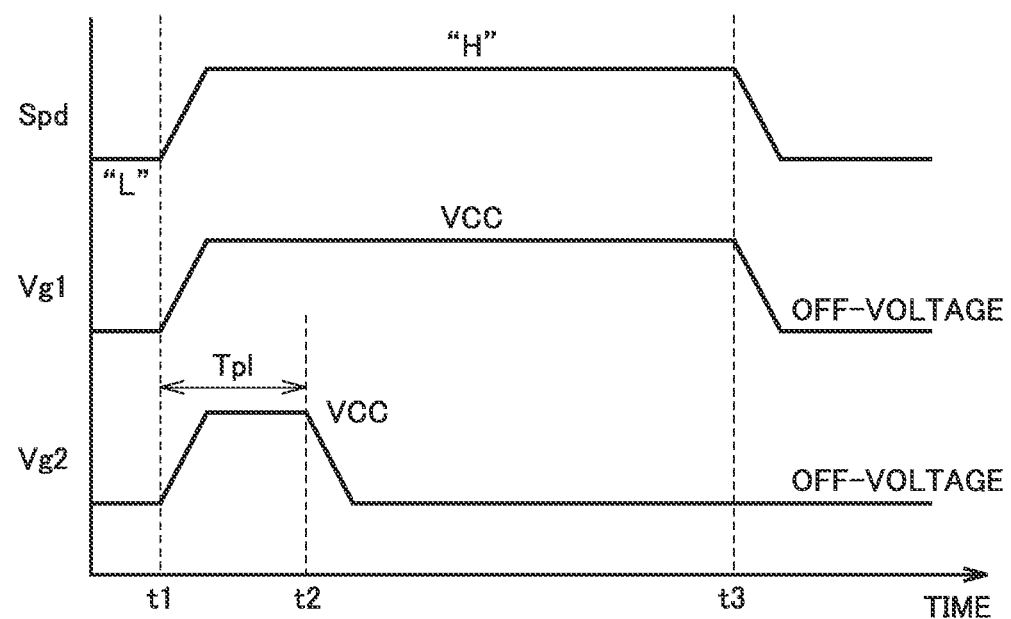
FIG. 6 is a conceptual waveform diagram illustrating a method of driving a semiconductor device according to the present embodiment.

FIG. 6 is a conceptual waveform diagram illustrating a method of driving a semiconductor device according to the present embodiment.

Referring to FIG. 6, before time t1, drive control signal Spd is at an L level so as to cause semiconductor device 100 to be turned off. Accordingly, gate voltage signals Vg1 and Vg2 are set at voltages for causing transistor cells 120a and 120b, respectively, to be turned off (which will be hereinafter also referred to as an "OFF-voltage"). The OFF-voltage is a ground voltage GND or a negative voltage, for example.

At time t1, drive control signal Spd transitions from an L level to an H level in order to cause semiconductor device 100 to be turned on. Accordingly, gate voltage signals Vg1 and Vg2 change from the OFF-voltages to voltages for causing transistor cells 120a and 120b, respectively, to be turned on (which will be hereinafter also referred to as an "ON-voltage"). The ON-voltage is a positive power supply voltage VCC, for example. Thereby, it becomes possible to implement the step of applying an ON-voltage to each of gate interconnections 114a and 114b correspondingly at time t1.

Gate voltage signal Vg1 is maintained at an ON-voltage in a time period in which drive control signal Spd is at an H level. In contrast, gate voltage signal Vg2 changes from the ON-voltage to an OFF-voltage at time t2 at which a prescribed time period Tp1 has elapsed since time t1. In other words, by gate voltage signal Vg2, during turn-on of semiconductor device 100, the ON-voltage can be applied in a pulse pattern to gate interconnection 114b in a time width corresponding to prescribed time period Tp1. Thereby, at and after time t2, it becomes possible to implement the step of applying an OFF-voltage to gate interconnection 114b and applying an ON-voltage to gate interconnection 114a.

At time t3, drive control signal Spd transitions from an H level to an L level in order to cause semiconductor device 100 to be turned off. Accordingly, gate voltage signal Vg1 changes from the ON-voltage to an OFF-voltage. On the other hand, gate voltage signal Vg2 is maintained at an OFF-voltage similarly to the situation at and after time t2.

Then, the operation of semiconductor device 100 according to gate voltage signals Vg1 and Vg2 shown in FIG. 6 will be described.

Again referring to FIG. 2, when an ON-voltage higher than the threshold voltage is applied to gate interconnection 114a at time t1, channel region 113a is inverted into an N type to thereby form a channel. Similarly, by applying an ON-voltage to gate interconnection 114b, channel region 113b is inverted into an N type to thereby form a channel.

Through the channels formed in channel regions 113a and 113b, electrons are injected from emitter electrode 111 via charge storage layer 107 into N⁻ drift layer 106. By these injected electrons, a forward bias is applied between P⁺ substrate (collector layer) 101 and N⁻ drift layer 106 through N⁺ buffer layer 102. Then, holes are injected from collector electrode 103 through P⁺ substrate (collector layer) 101 and N⁺ buffer layer 102 into N⁻ drift layer 106. Consequently, the resistance in N⁻ drift layer 106 is significantly reduced by conductivity modulation, thereby increasing the current capacity as an IGBT.

At time t2, when an OFF-voltage is supplied to gate interconnection 114b, in transistor cell 120b, the gate-emitter voltage becomes zero or a negative voltage, and then, channel region 113b is returned to a P type. Thereby, the channel disappears. Accordingly, in transistor cell 120b, an electronic current stops flowing as supply of the electrons injected from emitter electrode 111 is stopped. On the other hand, in channel region 113a corresponding to gate interconnection 114a to which an ON-voltage is supplied, channel formation is maintained. Thus, the electronic current continuously flows through transistor cell 120a.

Accordingly, in the ON period of semiconductor device 100 (Spd=H level), the electronic current by each of the plurality of transistor cells 120a and 120b flows as collector current Ic from time t1 to time t2. On the other hand, from time t2 to time t3, only the electronic current by the plurality of transistor cells 120a flows as collector current Ic.

At time t3, when an OFF-voltage is supplied to gate interconnection 114a, also in transistor cell 120a, the gate-emitter voltage becomes zero or a negative voltage, and then, channel region 113a is returned to a P type. Thereby, the channel disappears also in channel region 113a. Thus, also in transistor cell 120a, supply of the electrons injected from emitter electrode 111 is stopped. Consequently, since an electronic current does not flow through all of the plurality of transistor cells 120a and 120b, semiconductor device 100 is turned off, with the result that Ic=0.

Figure 7:
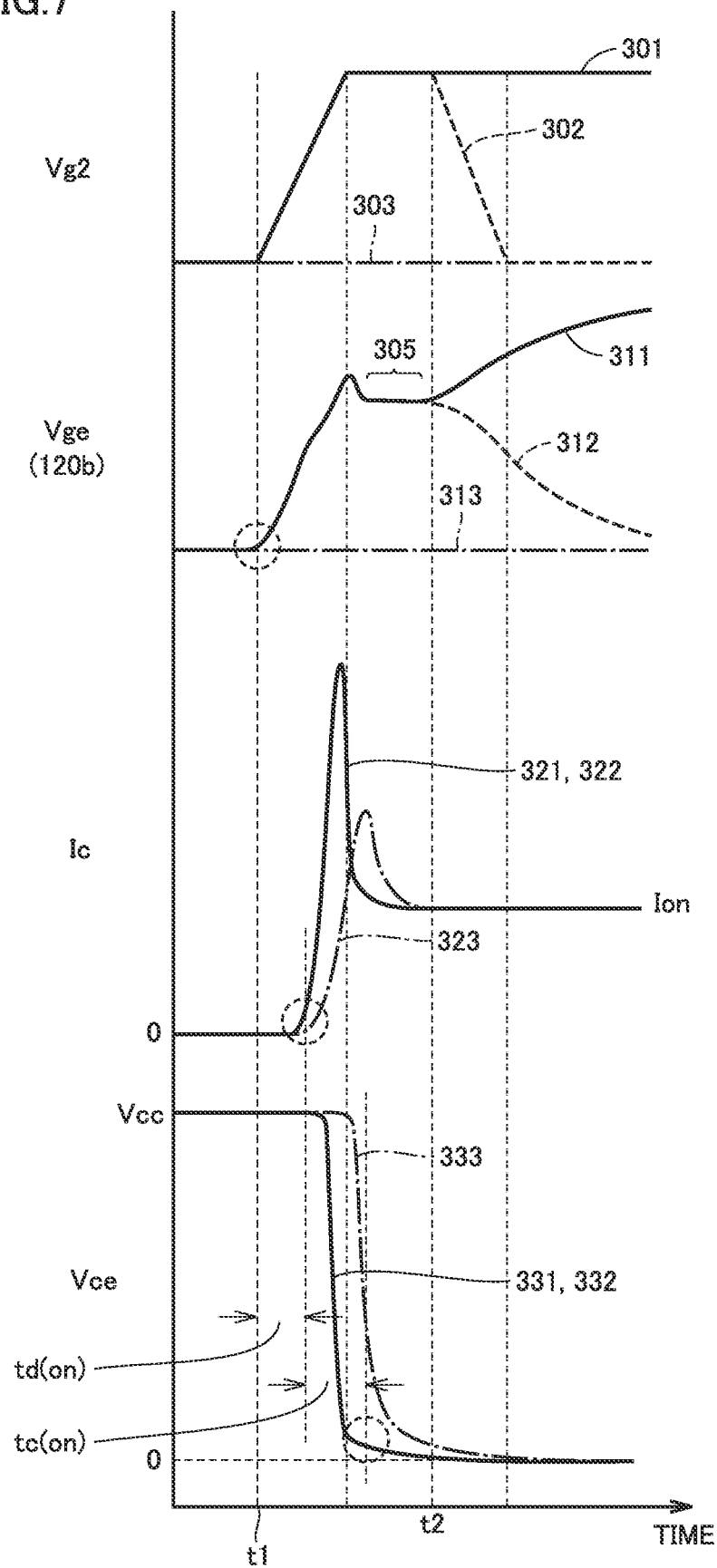
FIG. 7 is a simulation waveform diagram during turn-on of the semiconductor device.
Figure 8:
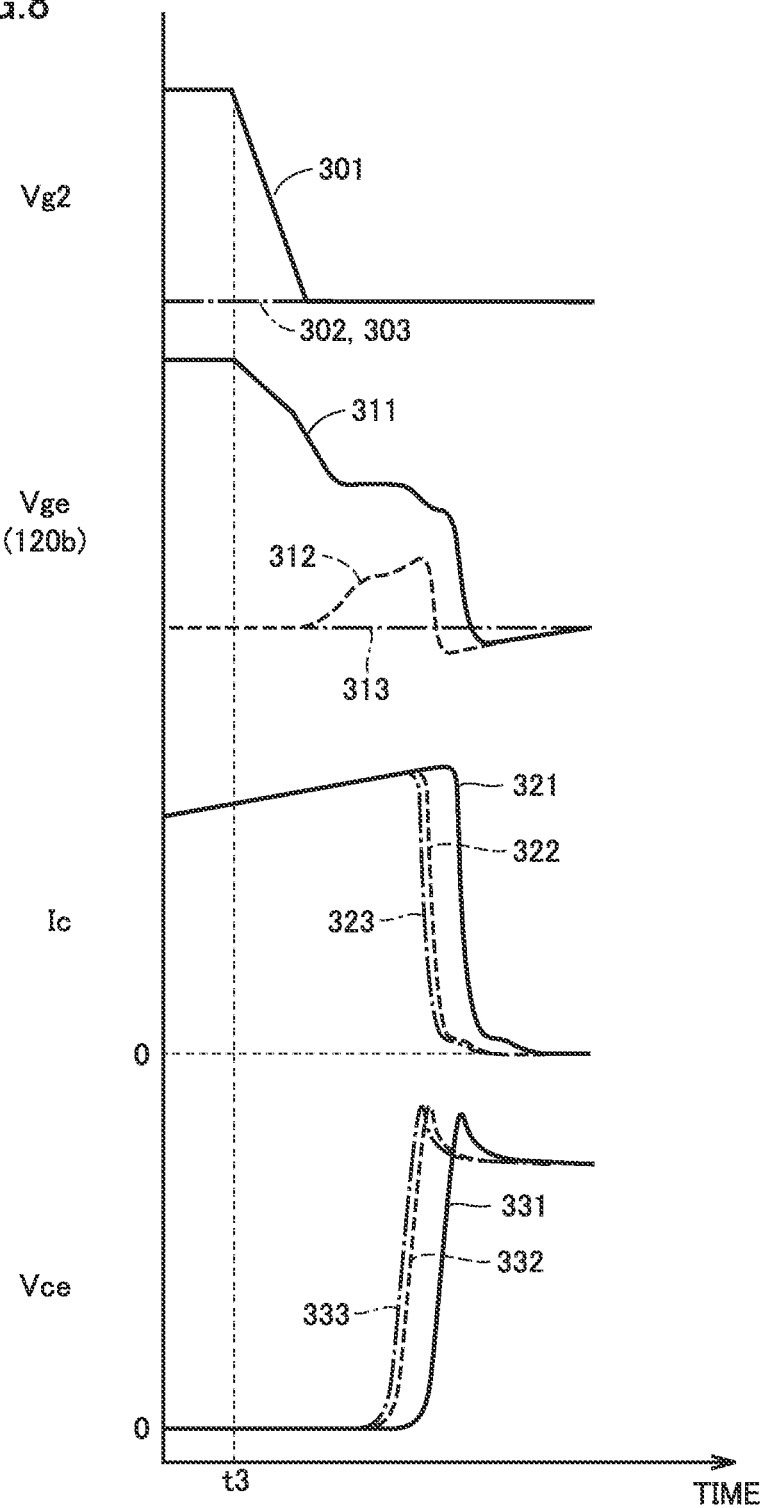
FIG. 8 is a simulation waveform diagram during turn-off of the semiconductor device.
Figure 9:
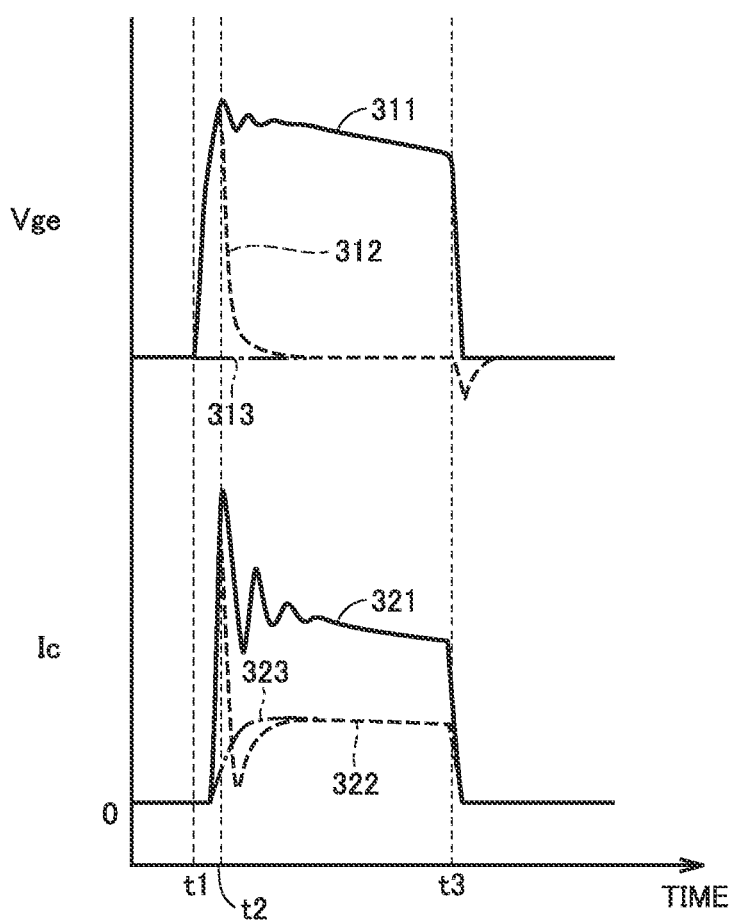
FIG. 9 is a simulation waveform diagram at the time when a load short-circuit occurs during turn-on of the semiconductor device.

Then, FIGS. 7 to 9 each show a simulation waveform during turn-on and turn-off of semiconductor device 100. Through FIGS. 7 to 9, based on the setting of Vg1 (transistor cell 120a) according to the waveform in FIG. 6, the setting of Vg2 (transistor cell 120b) was compared among the following three cases.

The first case shows a normal driving method in which Vg2=Vg1 so as to cause all transistor cells 120 to be operated in parallel. The second case shows a driving method according to the present embodiment in which Vg2 is set in a pulsed waveform shown in FIG. 6. The third case shows a driving method provided for comparison in which Vg2 is maintained at an OFF-voltage.

FIG. 7 shows a simulation waveform during turn-on of semiconductor device 100. FIG. 8 shows a simulation waveform during turn-off of semiconductor device 100. In FIGS. 7 and 8, the normal turn-on operation and turn-off operation without occurrence of a load short-circuit are simulated.

Referring to FIG. 7, as to gate voltage signal Vg2, a waveform 301 in the first case is the same as the waveform of Vg1 in FIG. 6. On the other hand, a waveform 302 in the second case is the same as the waveform of Vg2 in FIG. 6. As to a third waveform 303 in the third case, Vg2 is maintained at an OFF-voltage.

Also for gate-emitter voltage Vge on transistor cell 120b controlled by gate voltage signal Vg2, waveforms 311 to 313 in the first to third cases are shown. In waveforms 311 and 312, Vge increases as gate voltage signal Vg2 is set at an ON-voltage. At some midpoint where Vge increases, there occurs a Miller period 305 in which Vge becomes constant.

Miller period 305 occurs at a fixed timing according to the driving conditions by drive circuit 130 and the element characteristics of semiconductor device 100. Thus, the timing of occurrence of Miller period 305 can be learned in advance by real system experiments or simulations.

In waveform 312, Vge also decreases as Vg2 changes to an OFF-voltage at and after time t2. When Vg2=0, waveform 313 is maintained at Vge=0.

As to collector current Ic in the entire semiconductor device 100, waveforms 321 to 323 in the first to third cases are shown. Also as to collector-emitter voltage Vce, waveforms 331 to 333 in the first to third cases are shown.

As to collector current Ic, the behaviors of waveforms 321 and 322 are approximately the same until time t2. On the other hand, waveform 323 in the third case where no channel is formed in each transistor cell 120b is slower in current rising rate than waveforms 321 and 322. Also, it is understood that waveform 323 in the third case is lower in peak current relative to a steady current Ion during turn-on than waveforms 321 and 322. In the second and third cases, the simulations are performed while adjusting the switching conditions such that Ion of collector current Ic is equal to that in the first case.

As to collector-emitter voltage Vce, the behaviors of waveforms 331 and 332 are approximately the same until time t2. On the other hand, it is understood that waveform 333 in the third case in which no channel is formed in each transistor cell 120b is slower in voltage falling timing than waveforms 331 and 332.

In addition, time t2 at which gate voltage signal Vg2 is changed into an OFF-voltage is set at the time after the end of Miller period 305. Thereby, at time t2, collector current Ic=Ion, and collector-emitter voltage Vce is approximately zero. Thus, it is understood that turn-on of semiconductor device 100 is mostly completed in this state.

From the simulation results in FIG. 7, it is understood that the change rates of Ic and Vce during turn-on are slower in the third case than in the first case. Accordingly, it is feared that switching loss may increase in the third case. On the other hand, the behaviors of Ic and Vce during turn-on are approximately the same between the first case and the second case. Thus, it is understood that, even when gate voltage signal Vg2 is set as a pulsed voltage, switching loss during turn-on is equal to that in the first case as a normal driving method.

FIG. 8 shows a simulation waveform during turn-off of semiconductor device 100.

Referring to FIG. 8, at time t3, gate voltage signal Vg1 changes from an ON-voltage to an OFF-voltage, thereby causing semiconductor device 100 to be turned off. As to gate voltage signal Vg2, waveform 301 in the first case is the same as the waveform of Vg1 in FIG. 6. On the other hand, in waveform 302 in the second case and waveform 303 in the third case, Vgs during turn-off is fixed at an OFF-voltage.

As to collector current Ic and collector-emitter voltage Vce, during turn-off, the number of transistor cells 120 in which a channel is formed in the ON state is less in the third case (waveforms 323 and 333) than in the first case (waveforms 321 and 331). Thus, Vce rises and Ic falls at an earlier timing.

The behaviors of Ic and Vce in the second case (waveforms 322 and 332) are close to those in the third case (waveforms 323 and 333). It is to be noted that (i) the time difference between the rising timing of Vce and the falling timing of Ic, and (ii) inclinations of Vce and Ic are identical among the first to third cases. Thus, it is understood that switching loss during turn-off is identical among the first to third cases.

In this way, even when the driving method according to the present embodiment (the second case) is applied to the operation in which no load short-circuit occurs, that is, to the normal turn-on and turn-off operations, switching loss does not deteriorate as compared with the normal driving method (the first case).

FIG. 9 shows a simulation waveform during turn-on at the time when a load short-circuit occurs. In FIG. 9, the simulation was performed on the condition that the voltage (that is, Vce) applied to semiconductor device 100 is set to be 1.5 times higher than those (equivalent to two-thirds higher than the rated voltage) in FIGS. 7 and 8.

Also, FIG. 9 is different in time-axis scale from FIGS. 7 and 8, but shows time t1, time t2 and time t3 at the same timings as those in FIGS. 7 and 8. Accordingly, also in FIG. 9, in the first case, Vg1 and Vg2 are maintained at an ON-voltage from time t1 to time t3. In the second case, Vg1 is maintained at an ON-voltage from time t1 to time t3, whereas Vg2 is set at an ON-voltage in a pulse pattern from time t1 to time t2. In the third case, Vg1 is maintained at an ON-voltage from time t1 to time t3, whereas Vg2 is maintained at an OFF-voltage from time t1 to time t3.

As a result, gate-emitter voltage Vge on transistor cell 120b that is controlled by gate voltage signal Vg2 shows the behaviors of waveforms 311, 312 and 313 in the first, second and third cases, respectively. Also, collector current Ic shows the behaviors of waveforms 321, 322 and 323 in the first, second and third cases, respectively. As described above, Vce is a constant value in the simulation in FIG. 9.

As shown by waveforms 311 to 313 and waveforms 321 to 323, in the second case, collector current Ic equal to that in the first case is produced in the time period immediately after turn-on, but the current in transistor cell 120b corresponding to gate interconnection 114b is interrupted at and after time t2 in which gate voltage signal Vg2 changes to an OFF-voltage. Thereby, it is understood that collector current Ic can be suppressed. Thus, as to "Ic×Vce" defining the short-circuit duration until a short-circuit fault occurs in semiconductor device 100 when an overcurrent occurs due to occurrence of a load short-circuit and the like, it is understood that this "Ic×Vce" can be reduced more significantly in the second case than in the first case. As a result, the short-circuit duration corresponding to ESC/∫(Ic×Vce) dt can be secured longer in the second case than in the first case.

In the third case, collector current Ic can be entirely suppressed, but the peak value during turn-on is also reduced. This may consequently lead to a concern that a problem may occur in detection of a short-circuit fault resulting from an excessive collector current Ic. In other words, from the comparison between waveforms 321 and 322, it is understood that detection of a load short-circuit based on the peak value of collector current Ic can be performed in the same manner as in the first case (the normal driving method) even when gate voltage signal Vg2 is in a pulse pattern.

In this way, according to the method of driving semiconductor device 100 in the present embodiment, by applying an ON-voltage in a pulse pattern only immediately after turn-on to some of the gate interconnections (gate interconnection 114b), collector current Ic can be suppressed during occurrence of a load short-circuit without increasing switching loss during the normal operation (while no load short-circuit occurs). As a result, without increasing switching loss, it becomes possible to secure a time period (a short-circuit duration) until a short-circuit fault occurs in semiconductor device 100 when a load short-circuit occurs.

In addition, gate voltage controller 132 serving to generate gate voltage signal Vg2 can be configured to have a function of a commonly-used one-shot pulse generation circuit configured to output a pulse voltage in a predetermined time width Tp1 in response to transition of drive control signal Spd from an H level to an H level.

In this case, it is preferable that time width Tp1 is set based on the behaviors of the voltage and the current during turn-on. For example, it is preferable that time width Tp1 of the pulse voltage (FIG. 6) is set to be equal to or greater than the total sum of a time width td(on) and a time width tc(on) shown in FIG. 7 (that is, Tp1≥td(on)+tc(on)).

As shown in FIG. 7, time width td(on) corresponds to the required time period from the timing of rising of gate voltage signals Vg1 and Vg2 (time t1) until the start of rising of collector current Ic. Time width tc(on) corresponds to the required time period from the start of rising of collector current Ic until the end of falling of collector-emitter voltage Vce. Within the time period in which the above-mentioned current and voltage change, gate voltage signal Vg2 is set at an ON-voltage, to thereby increase the collector current per unit time, so that switching loss can be suppressed. In other words, assuming that Tp1<td(on)+tc(on), rising of collector current Ic and/or falling of Vce are/is slowed down, which leads to a concern that switching loss may increase as compared with the normal driving method (the first case).

On the other hand, as can be understood from FIG. 9, when a load short-circuit occurs, as pulse-shaped time width Tp1 of gate voltage signal Vg2 is shorter, the effect of suppressing collector current Ic (that is, the effect of securing the insulation duration) is more enhanced. When it is difficult to determine the end timing of the tc(on) section (the timing at which Vce falls) only based on the Vce waveform, the timing at which Vce reliably falls can be determined based on the timing at which the Miller period ends. It is preferable that time width Tp1 is set at the timing after a lapse of td(on)+tc(on) or after the timing at which the Miller period ends.

Based on the above, it is preferable that time width Tp1 is set such that gate voltage signal Vg2 changes into an OFF-voltage at the timing at which td(on)+tc(on) has elapsed since time t1 or at the timing later than the timing at which the Miller period ends. In this case, as having been described in FIG. 7, the behaviors of Vge, Ic and Vce until time t2 are approximately the same between the normal driving method (the first case) and the present embodiment in which the ON-voltage on a part of the gate interconnection is set in a pulse pattern immediately after turn-on (the second case).

Accordingly, as to time width Tp1 of the pulsed voltage in the present embodiment, a fixed value can be defined in advance according to the behavior during turn-on of semiconductor device 100 (specifically, the results of actually measuring Ic, Vge and Vce or the simulation results) in the normal driving method (in which an ON-voltage is applied in common to each gate interconnection). Thus, the OFF timing for the pulsed voltage can be fixed in advance and set by a counter and the like. In other words, in order to determine the OFF timing for the pulsed voltage, the voltage and the current (Ic, Vge, Vce) does not have to be monitored during the switching operation.

(Modifications)

The above description has been made with regard to the configuration in which a gate interconnection is divided into two types of sections so as to independently control their respective gate voltage signals, but the gate interconnection may also be able to be divided into three or more sections.

Figure 10:
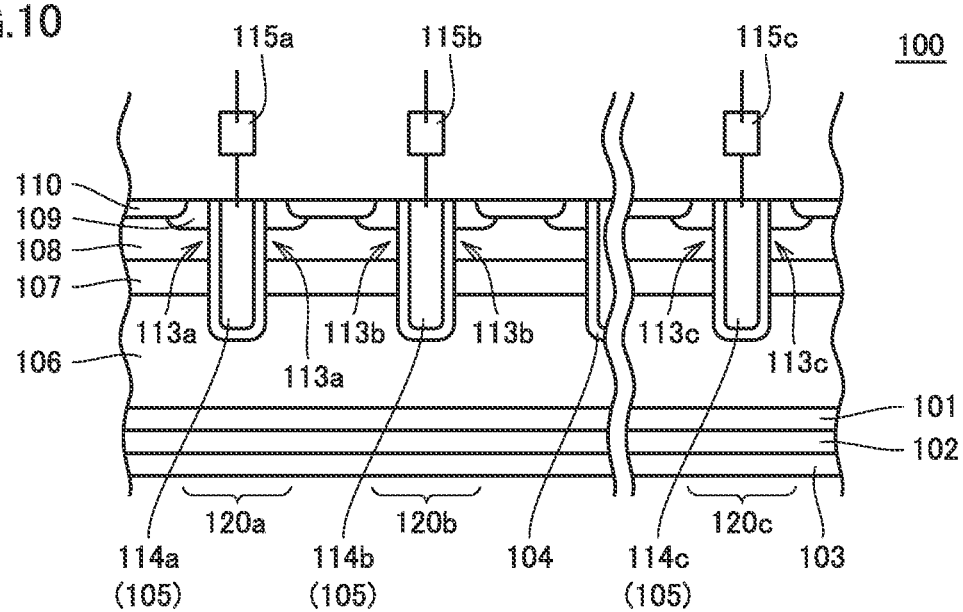
FIG. 10 is a cross-sectional view illustrating a modification of the configuration of the semiconductor device to which the driving method according to the present embodiment is applied.

FIG. 10 is a cross-sectional view illustrating a modification of the configuration of the semiconductor device to which the driving method according to the present embodiment is applied.

When comparing FIG. 10 with FIG. 2, in the configuration in FIG. 10, three types of gate interconnections 114a, 114b and 114c are disposed as a plurality of gate interconnections for constituting gate electrode 105 (FIG. 1) in each transistor cell 120 (FIG. 1). Gate interconnections 114a, 114b and 114c are electrically connected to gate pads 115a, 115b and 115c, respectively. Gate pads 115a to 115c are electrically insulated from each other and receive separate voltage signals from drive circuit 130 (FIG. 4).

Accordingly, in the configuration example in FIG. 10, the plurality of transistor cells 120 include: a transistor cell 120a having a gate electrode 105 formed of a gate interconnection 114a; a transistor cell 120b having a gate electrode 105 formed of a gate interconnection 114b; and a transistor cell 120c having a gate electrode 105 formed of a gate interconnection 114c. In other words, transistor cell 120a has a channel region 113a in which a current is controlled according to the voltage on gate interconnection 114a. Transistor cell 120b has a channel region 113b in which a current is controlled according to the voltage on gate interconnection 114b. Transistor cell 120c has a channel region 113c in which a current is controlled according to the voltage on gate interconnection 114c.

Figure 11:
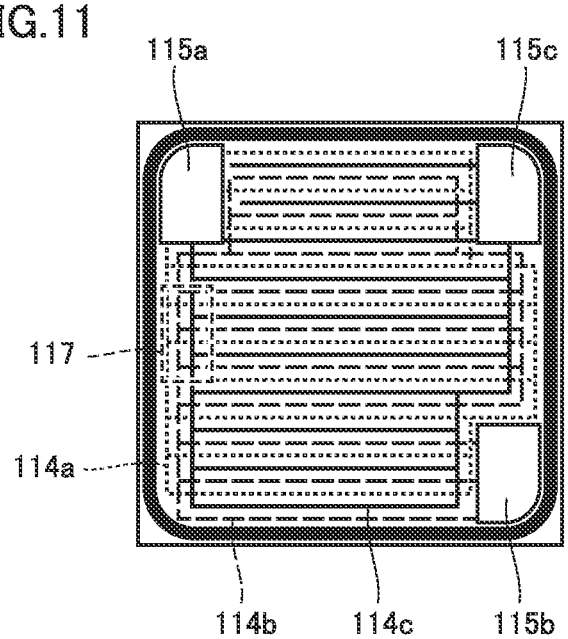
FIG. 11 is a plan view illustrating an arrangement example of a gate interconnection in the semiconductor device according to the modification shown in FIG. 10.

FIG. 11 is a plan view illustrating an arrangement example of a gate interconnection in the semiconductor device shown in FIG. 10.

Referring to FIG. 11, each of gate interconnections 114a to 114c is provided so as to include a periodical interconnection pattern for forming a gate electrode portion extending in the same direction (in the left-to-right direction in the figure). In FIG. 11, three types of gate interconnections are periodically arranged in order of "114a, 114b, 114c, 114a, 114b, 114c, . . . ", but can be periodically arranged in a different order. The number of arranged gate interconnections 114a, the number of arranged gate interconnections 114b and the number of arranged gate interconnections 114c may be different as long as the gate interconnections are periodically arranged, for example, as in "114a, 114b, 114c, 114b, 114a, 114b, 114c, 114b, . . . " or "114a, 114a, 114b, 114c, 114a, 114a, 114b, 114c, . . . ".

In a region 117, gate interconnections 114a to 114c are disposed to intersect with each other in a plan view but are arranged in different layers, so that gate interconnections 114a to 114c are not electrically connected to each other.

Furthermore, gate interconnections 114a, 114b and 114c are electrically connected to gate pads 115a, 115b and 115c, respectively. Gate pads 115a to 115c can also be disposed in interconnection layers different from those of gate interconnections 114a to 114c. It is preferable that gate pads 115a to 15c are also disposed to be spaced apart from each other in order to avoid interference of wires.

Gate voltage signal Vg1 in FIG. 6 is applied to one or two of gate interconnections 114a to 114c while the pulsed voltage (gate voltage signal Vg2 in FIG. 6) only immediately after turn-on is applied to each remaining gate interconnection. When a pulsed voltage is applied to two types of gate interconnections, a voltage (for example, gate voltage signal Vg3) having a pulse width different from that of gate voltage signal Vg2 (FIG. 6) may be applied to one of the two types of gate interconnections. In such a case, in addition to gate voltage controllers 131 and 132, drive circuit 130 further includes a gate drive controller for outputting gate voltage signal Vg3.

Furthermore, the gate interconnection may be able to be divided into four or more types of gate interconnections. In the configuration in which the gate interconnection is divided into N types (N: an integer equal to or greater than three) of gate interconnections, drive circuit 130 controls gate voltage signal Vg1 in FIG. 6 to be applied to K types (K: an integer of 1≤K≤(N−1)) of gate interconnections among N types of gate interconnections.

Furthermore, drive circuit 130 can apply a pulsed voltage only immediately after turn-on to remaining (N−K) types of gate interconnections. In this case, gate voltage signal Vg2 in FIG. 6 is applied to some or all of (N−K) types of gate interconnections. In addition, when a pulsed voltage is applied to two or more types of gate interconnections, the pulse width can also be changed therebetween.

Thereby, as having been described in the present embodiment, the time period taken until occurrence of a load short-circuit in the case of occurrence of a short-circuit fault can be secured without increasing switching loss in the semiconductor device.

The configuration of the semiconductor device to which the driving method and the drive circuit described in the present embodiment are applied is not limited to the CSTBT structure illustrated in FIGS. 1 and 2. In other words, the semiconductor device configured to include a plurality of semiconductor elements electrically connected in parallel may be a target to be driven, to which the present invention is applied, as long as it is configured to control the gate voltage by means of a plurality of gate interconnections electrically insulated from each other.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 100 semiconductor device, 101 P$^+$ substrate, 102 N$^+$ buffer layer, 103 collector electrode, 104 gate insulating film, 105 gate electrode, 106 N$^-$ drift layer, 107 charge storage layer, 108 channel dope layer, 109 source injection region, 110 P$^+$ diffusion region, 111 emitter electrode, 112 oxide film, 113, 113a, 113b, 113c channel region, 114a, 114b, 114c gate interconnection, 115a, 115b, 115c gate pad, 120, 120a, 120b, 120c transistor cell, 130 drive circuit, 131, 132 gate voltage controller, 301 to 303, 311 to 313, 321 to 323, 331 to 333 waveform (simulation) 305 Miller period, GND ground voltage, Ic collector current, Tp1 prescribed time period (time width), Vg1, Vg2 gate voltage signal.

The invention claimed is:

1. A method of driving a semiconductor device including a plurality of semiconductor elements electrically connected in parallel, and a plurality of gate interconnections electrically insulated from each other, the plurality of gate interconnections including a first gate interconnection and a second gate interconnection, the plurality of semiconductor elements including at least one first semiconductor element having a first channel region in which a current is controlled by a voltage on the first gate interconnection, and at least one second semiconductor element having a second channel region in which a current is controlled by a voltage on the second gate interconnection, the method comprising:

applying, in response to transition of a drive control signal from a first signal level to a second signal level that turns on the semiconductor device, an ON-voltage of the semiconductor device to each of the first gate interconnection and the second gate interconnection when the semiconductor device is turned on; and after a lapse of a predetermined time period since start of application of the ON-voltage, and while the second signal level of the drive control signal is maintained, applying an OFF-voltage of the semiconductor device to the second gate interconnection and applying the ON-voltage to the first gate interconnection, wherein a timing of applying the OFF-voltage to the second gate interconnection is set corresponding to a timing at which a total sum of a first required time period and a second required time period is passed since start of application of the ON-voltage to the each of the first gate interconnection and the second gate interconnection, the first required time period is a time period from start of application of the ON-voltage until start of rising of a current across terminals of the semiconductor device, the second required time period is a time period from start of rising of the current across terminals until falling of a voltage across terminals of the semiconductor device, and the timing of applying the OFF-voltage to the second gate interconnection is set to be closer to the time of applying the ON-voltage to the first and second gate interconnections than to the time of applying an OFF-voltage to the first gate interconnection.

2. A method of driving a semiconductor device including a plurality of semiconductor elements electrically connected in parallel, and a plurality of gate interconnections electrically insulated from each other, the plurality of gate interconnections including a first gate interconnection and a second gate interconnection, the plurality of semiconductor elements including at least one first semiconductor element having a first channel region in which a current is controlled by a voltage on the first gate interconnection, and at least one second semiconductor element having a second channel region in which a current is controlled by a voltage on the second gate interconnection, the method comprising:

applying an ON-voltage of the semiconductor device to each of the first gate interconnection and the second gate interconnection when the semiconductor device is turned on; and after a lapse of a predetermined time period since start of application of the ON-voltage, applying an OFF-voltage of the semiconductor device to the second gate interconnection and applying the ON-voltage to the first gate interconnection, wherein the predetermined time period is determined such that the OFF-voltage is applied to the second gate interconnection right after a Miller period, in which a gate-emitter voltage of the at least one second semiconductor element becomes constant after the gate-emitter voltage increases as applying the ON-voltage.

3. A drive circuit for a semiconductor device including a plurality of semiconductor elements electrically connected in parallel and a plurality of gate interconnections electrically insulated from each other, the plurality of gate interconnections including a first gate interconnection and a second gate interconnection, the plurality of semiconductor elements including at least one first semiconductor element having a first channel region in which a current is controlled by a voltage on the first gate interconnection, and at least one second semiconductor element having a second channel region in which a current is controlled by a voltage on the second gate interconnection, the drive circuit comprising:

a first gate voltage controller configured to apply an ON-voltage or an OFF-voltage of the semiconductor device to the first gate interconnection according to a drive control signal, the drive control signal transitioning from a first signal level to a second signal level when the semiconductor device is turned on and transitioning from the second signal level to the first signal level when the semiconductor device is turned off; and a second gate voltage controller configured to apply the ON-voltage or the OFF-voltage to the second gate interconnection according to the drive control signal, wherein the first gate voltage controller is configured to
apply the OFF-voltage to the first gate interconnection when the drive control signal is at the first signal level, and
apply the ON-voltage to the first gate interconnection when the drive control signal is at the second signal level, and the second gate voltage controller is configured to apply the ON-voltage in a pulse pattern to the second gate interconnection in a predetermined time width when the drive control signal transitions from the first signal level to the second signal level, the predetermined time width is expired while the second signal level of the drive control signal is maintained, wherein the second gate voltage controller is configured to set a timing of applying the OFF-voltage to the second gate interconnection as corresponding to a timing at which a total sum of a first required time period and a second required time period is passed since start of application of the ON-voltage to the each of the first gate interconnection and the second gate interconnection, the first required time period is a time period from start of application of the ON-voltage until start of rising of a current across terminals of the semiconductor device, the second required time period is a time period from start of rising of the current across terminals until falling of a voltage across terminals of the semiconductor device, and the second gate voltage controller is configured to set the timing of applying the OFF-voltage to the second gate interconnection closer to the time of applying the ON-voltage to the first and second gate interconnections than to the time of applying an OFF-voltage to the first gate interconnection.

4. A drive circuit for a semiconductor device including a plurality of semiconductor elements electrically connected in parallel and a plurality of gate interconnections electrically insulated from each other, the plurality of gate interconnections including a first gate interconnection and a second gate interconnection, the plurality of semiconductor elements including at least one first semiconductor element having a first channel region in which a current is controlled by a voltage on the first gate interconnection, and at least one second semiconductor element having a second channel region in which a current is controlled by a voltage on the second gate interconnection, the drive circuit comprising:
  a first gate voltage controller configured to apply an ON-voltage or an OFF-voltage of the semiconductor device to the first gate interconnection according to a drive control signal, the drive control signal transitioning from a first signal level to a second signal level when the semiconductor device is turned on and transitioning from the second signal level to the first signal level when the semiconductor device is turned off; and
  a second gate voltage controller configured to apply the ON-voltage or the OFF-voltage to the second gate interconnection according to the drive control signal, wherein
the first gate voltage controller is configured to
  apply the OFF-voltage to the first gate interconnection when the drive control signal is at the first signal level, and
  apply the ON-voltage to the first gate interconnection when the drive control signal is at the second signal level, and
the second gate voltage controller is configured to apply the ON-voltage in a pulse pattern to the second gate interconnection in a predetermined time width when the drive control signal transitions from the first signal level to the second signal level,
wherein the predetermined time width is determined such that the OFF-voltage is applied to the second gate interconnection right after a Miller period, in which a gate-emitter voltage of the at least one second semiconductor element becomes constant after the gate-emitter voltage increases as applying the ON-voltage.

\* \* \* \* \*